(12) United States Patent
Olson et al.

(10) Patent No.: US 6,281,426 B1
(45) Date of Patent: Aug. 28, 2001

(54) MULTI-JUNCTION, MONOLITHIC SOLAR CELL USING LOW-BAND-GAP MATERIALS LATTICE MATCHED TO GAAS OR GE

(75) Inventors: Jerry M. Olson, Lakewood; Sarah R. Kurtz, Golden; Daniel J. Friedman, Lakewood, all of CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/615,297

(22) Filed: Jul. 13, 2000

Related U.S. Application Data

(63) Continuation of application No. 09/165,039, filed on Oct. 1, 1998, now abandoned.
(60) Provisional application No. 60/060,729, filed on Oct. 1, 1997.

(51) Int. Cl.[7] ................................................. H01L 25/00
(52) U.S. Cl. .......................... 136/249; 136/261; 136/262
(58) Field of Search .................................. 136/249, 261, 136/262

(56) References Cited

U.S. PATENT DOCUMENTS

| | | | |
|---|---|---|---|
| 4,179,702 | * 12/1979 | Lamorte | 357/30 |
| 4,206,002 | * 6/1980 | Sabnis et al. | 136/89 MS |
| 4,667,059 | * 5/1987 | Olson | 136/249 |
| 4,867,801 | * 9/1989 | Stanbery | 136/249 |
| 4,915,744 | * 4/1990 | Ho et al. | 136/262 |
| 5,009,719 | * 4/1991 | Yoshida | 136/249 |
| 5,223,043 | * 6/1993 | Olson et al. | 136/249 |
| 5,261,969 | * 11/1993 | Stanbery | 136/249 |
| 5,316,593 | * 5/1994 | Olson et al. | 136/262 |
| 5,322,572 | * 6/1994 | Wanlass | 136/249 |
| 5,405,453 | * 4/1995 | Ho et al. | 136/249 |
| 5,407,491 | * 4/1995 | Freundlich et al. | 136/249 |
| 5,944,913 | * 8/1999 | Hou et al. | 136/255 |

* cited by examiner

Primary Examiner—Mark Chapman
(74) Attorney, Agent, or Firm—Paul J. White

(57) ABSTRACT

A multi-junction, monolithic, photovoltaic solar cell device is provided for converting solar radiation to photocurrent and photovoltage with improved efficiency. The solar cell device comprises a plurality of semiconductor cells, i.e., active p/n junctions, connected in tandem and deposited on a substrate fabricated from GaAs or Ge. To increase efficiency, each semiconductor cell is fabricated from a crystalline material with a lattice constant substantially equivalent to the lattice constant of the substrate material. Additionally, the semiconductor cells are selected with appropriate band gaps to efficiently create photovoltage from a larger portion of the solar spectrum. In this regard, one semiconductor cell in each embodiment of the solar cell device has a band gap between that of Ge and GaAs. To achieve desired band gaps and lattice constants, the semiconductor cells may be fabricated from a number of materials including Ge, GaInP, GaAs, GaInAsP, GaInAsN, GaAsGe, BGaInAs, (GaAs)Ge, CuInSSe, CuAsSSe, and GaInAsNP. To further increase efficiency, the thickness of each semiconductor cell is controlled to match the photocurrent generated in each cell. To facilitate photocurrent flow, a plurality of tunnel junctions of low-resistivity material are included between each adjacent semiconductor cell. The conductivity or direction of photocurrent in the solar cell device may be selected by controlling the specific p-type or n-type characteristics for each active junction.

44 Claims, 3 Drawing Sheets

MULTI-JUNCTION, MONOLITHIC SOLAR CELL USING LOW-BAND-GAP MATERIALS LATTICE MATCHED TO GAAS OR GE

CROSS-REFERENCE TO RELATED APPLICATION

This patent application is a continuation of copending U.S. patent application Ser. No. 09/165,039, filed in the U.S. Patent and Trademark Office on Oct. 1, 1998, now abandoned which claimed the benefit of priority under 35 U.S.C. §119 to U.S. Provisional Patent Application No. 60/060,729 filed on Oct. 1, 1997.

CONTRACTUAL ORIGIN OF THE INVENTION

The United States Government has rights in this invention under Contract No. DE-AC36-99GO10337 between the United States Department of Energy and the National Renewable Energy Laboratory, a Division of the Midwest Research Institute.

BACKGROUND OF THE INVENTION

1. Field of the Invention

The present invention relates generally to photovoltaic solar cells, and, more particularly, to a high-efficiency, multi-junction, lattice-matched, monolithic solar cell device. Even more particularly, the present invention is directed to a solar cell device that includes a semiconductor cell that is lattice-matched to GaAs and has an optimal band gap for enhancing the energy conversion efficiency of the solar cell device.

2. Description of the Prior Art

Solar energy is an important source of energy. Photovoltaic devices fabricated from layers of semiconductor materials, commonly called solar cells, are presently used to convert solar energy directly into electricity for many electrically powered applications. However, greater solar energy to electrical energy conversion efficiencies are still needed in solar cells to bring the cost per watt of electricity produced into line with the cost of generating electricity with fossil fuels and nuclear energy and to lower the cost of telecommunication satellites.

Solar energy, essentially light, comprises electromagnetic radiation in a whole spectrum of wavelengths, i.e., discrete particles or photons at various energy levels, ranging from higher energy ultraviolet with wavelengths less than 390 nm to lower energy near-infrared with wavelengths as long as 3000 nm. Between these ultraviolet and infrared wavelengths or electromagnetic radiation energy levels are the visible light spectrum, comprising violet, blue, green, yellow, orange, and red wavelengths or energy bands.

Because a semiconductor layer of a solar cell absorbs photons with energy greater than the band gap of the semiconductor layer, a low band gap semiconductor layer absorbs most of the photons in the received solar energy. However, useful electrical power produced by the solar cell is the product of the voltage and the current produced by the solar cell during conversion of the solar energy to electrical energy. Although a solar cell made from a low band gap material may generate a relatively large current, the voltage is often undesirably low for many implementations of solar cells.

To achieve the goal of using most of the photons in the solar spectrum while simultaneously achieving higher output voltage, multi-junction solar cells have been developed. Multi-junction solar cells generally include multiple, differently-configured semiconductor layers with two or more solar energy conversion junctions, each of which is designed to convert a different solar energy or wavelength band to electricity. Thus, solar energy in a wavelength band that is not absorbed and converted to electrical energy at one semiconductor junction may be captured and converted to electrical energy at another semiconductor junction in the solar cell that is designed for that particular wavelength range or energy band.

Several difficulties have arisen in producing these multi-junction solar cells which has limited their energy conversion efficiency. First, it has proven difficult to fabricate each semiconductor junction so as to maintain high photovoltaic device quality and simultaneously the appropriate band structure, electron energy levels, conduction, and absorption, that provide the photovoltaic effect within the solar cell as the multiple layers of different semiconductor materials are deposited to form the solar cells. It is understood that photovoltaic quality may be improved in monolithic solar cells by lattice matching adjacent layers of semiconductor materials in the solar cell, meaning that each crystalline semiconductor material that is deposited and grown to form the solar cell has similar crystal lattice constants or parameters. Mismatching at the semiconductor junctions in the solar cells continues in many fabricated solar cells to create defects or dislocations in the crystal lattice of the solar cell, which causes degradation of critical photovoltaic quality characteristics, such as open-circuit voltage, short-circuit current, and fill factor. Second, the energy conversion efficiency, including photocurrent and photovoltage, has proven difficult to maximize in multi-junction solar cells. Photocurrent flow can be improved if each solar cell junction of the semiconductor device can be current matched, in other words, to design each solar cell junction in the multi-junction device in a manner such that the electric current produced by each cell junction in the device is the same.

Current matching is important when a multi-junction solar cell device is fabricated with the individual semiconductor cells in the device connected (i.e., stacked) in series, because, in a series circuit, current flow is limited to the smallest current produced by any one of the individual cells in the device. Current matching can be controlled during fabrication by selecting and controlling the relative band gap energy absorption capabilities of the various semiconductor materials used to form the cell junctions and the thicknesses of each semiconductor cell in the multi-junction device. In contrast, the photovoltages produced by each semiconductor cell are additive, and preferably each semiconductor cell within a multi-cell solar cell is selected to provide small increments of power absorption (e.g., a series of gradually reducing band gap energies) to improve the total power, and specifically the voltage, output of the solar cell.

To address the above fabrication problems, a large number of materials and material compounds have been utilized in fabricating multi-junction, monolithic solar cell devices. However, these prior art solar cells have often resulted in lattice-mismatching, which may lead to photovoltaic quality degradation and reduced efficiency even for slight mismatching, such as less than 1 percent. Further, even when lattice-matching is achieved, these prior art solar cells often fail to obtain desired photovoltage outputs. This low efficiency is caused, at least in part, by the difficulty of lattice-matching each semiconductor cell to commonly used and preferred materials for the substrate, such as germanium (Ge) or gallium-arsenide (GaAs) substrates. As discussed above, it is preferable that each sequential junction absorb energy with a slightly smaller band gap to more efficiently convert the full spectrum of solar energy. In this regard, solar cells are stacked in descending order of band gap energy. However, the limited selection of known semiconductor materials, and corresponding band gaps, that have the same lattice constant as the above preferred substrate materials has continued to make it difficult to design and fabricate a multi-junction, monolithic solar cell that efficiently converts the received solar radiation to electricity. Therefore, a need remains to provide semiconductor materials with desirable band gap ranges and with a lattice constant that is substantially equivalent to that of Ge or GaAs to improve prior art photovoltage output and solar energy conversion efficiency for solar cells.

SUMMARY OF THE INVENTION

Accordingly, it is a general object of the present invention to provide a more efficient multi-junction, photovoltaic solar cell device than has been heretofore been available.

It is a specific object of the present invention to provide a high-efficiency, multi-junction, monolithic solar cell device in which each semiconductor cell or junction is fabricated from crystalline materials having substantially the same lattice constant and is photocurrent matched.

It is a related specific object of the present invention to provide a high-efficiency, multi-junction, monolithic solar cell with lattice and current matching in which GaAs or Ge is used as a growth substrate of the solar cell.

A further specific object of the present invention is to provide a multi-junction, monolithic solar cell with an improved photovoltage output, where GaAs or Ge is used as a growth substrate of the solar cell.

A still further specific object of the present invention is to provide a high-efficiency, multi-junction solar cell that may be readily and reliably fabricated or grown with high quality results from a substrate of well-known and accessible materials.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, each embodiment of the multi-junction, monolithic, photovoltaic solar cell comprises a plurality of semiconductor cells (i.e., junctions) deposited on a GaAs or Ge substrate with each semiconductor cell being fabricated from crystalline materials having substantially the same lattice constant as the substrate layer of GaAs or Ge and with at least one of the semiconductor cells having a band gap ranging from about 0.67 eV to about 1.4 eV, and preferably about 1 eV. In this manner, the solar cell of the present invention uniquely employs semiconductor materials to more fully capture and convert solar energy, especially in the 0.67 eV to 1.4 eV energy range which prior to this invention had not been efficiently utilized, while facilitating fabrication on a readily available and highly-functional GaAs or Ge substrate. The solar cell is connected in series with electrical contacts for applying a load to the solar cell, and in this regard, the semiconductor cells are each substantially current matched for improved photocurrent production by the solar cell. A tunnel junction is included between each semiconductor cell to allow photocurrent to flow readily between the semiconductor cells and is substantially a highly-doped semiconductor with very low resistance to current flow.

In one embodiment, a two-junction solar cell is provided which comprises a bottom junction of GaInAsN or GaAsGe material on the GaAs or Ge substrate and a top junction of GaInAsP material above the bottom junction. A second embodiment is a three-junction solar cell which includes an additional junction of Ge material underneath the bottom junction of the first embodiment. In a third embodiment, a three-junction solar cell is provided which comprises a bottom junction of GaInAsN or GaAsGe material on the GaAs or Ge substrate, a middle junction of GaAs material, and a top junction of GaInP material. A fourth embodiment provides a four-junction solar cell with, in descending order, a first junction of GaInP, a second junction of GaAs material, a third junction of GaInAsN or GaAsGe material, and a fourth junction of Ge material on a Ge substrate. In the above embodiments, each junction may be a n-on-p or a p-on-n type. Each junction is formed by a different arrangement of n-type and p-type material layers; the specific p-type or n-type conductivity for each active junction is established by the conductivity characteristics of the selected material layers. Additional layers may be included as part of each junction, in accordance with standard practice, to reduce problems such as photocarrier recombination. Also, additional layers may be added to each solar cell to control reflectivity within the solar cell. Further, after growth of the active and tunnel junction layers, the GaAs or Ge substrate may be removed from the above embodiments of the solar cell, thereby facilitating the use of the improved-efficiency, solar-energy converting junctions in a large number of solar cell circuit configurations. The use of the above listed materials for junctions, and others that will be detailed in the description, provides a solar cell in which each semiconductor cell or junction is lattice-matched, specifically with GaAs or Ge, and further, provides a junction with a more desirable band gap to improve the energy conversion efficiency of the solar cell.

BRIEF DESCRIPTION OF THE DRAWINGS

The accompanying drawings, which are incorporated in, and form a part of, the specifications, illustrate the preferred embodiments of the present invention and together with the descriptions serve to explain the principles of the invention. In the Drawings.

DESCRIPTION OF THE PREFERRED EMBODIMENT

Figure 1:
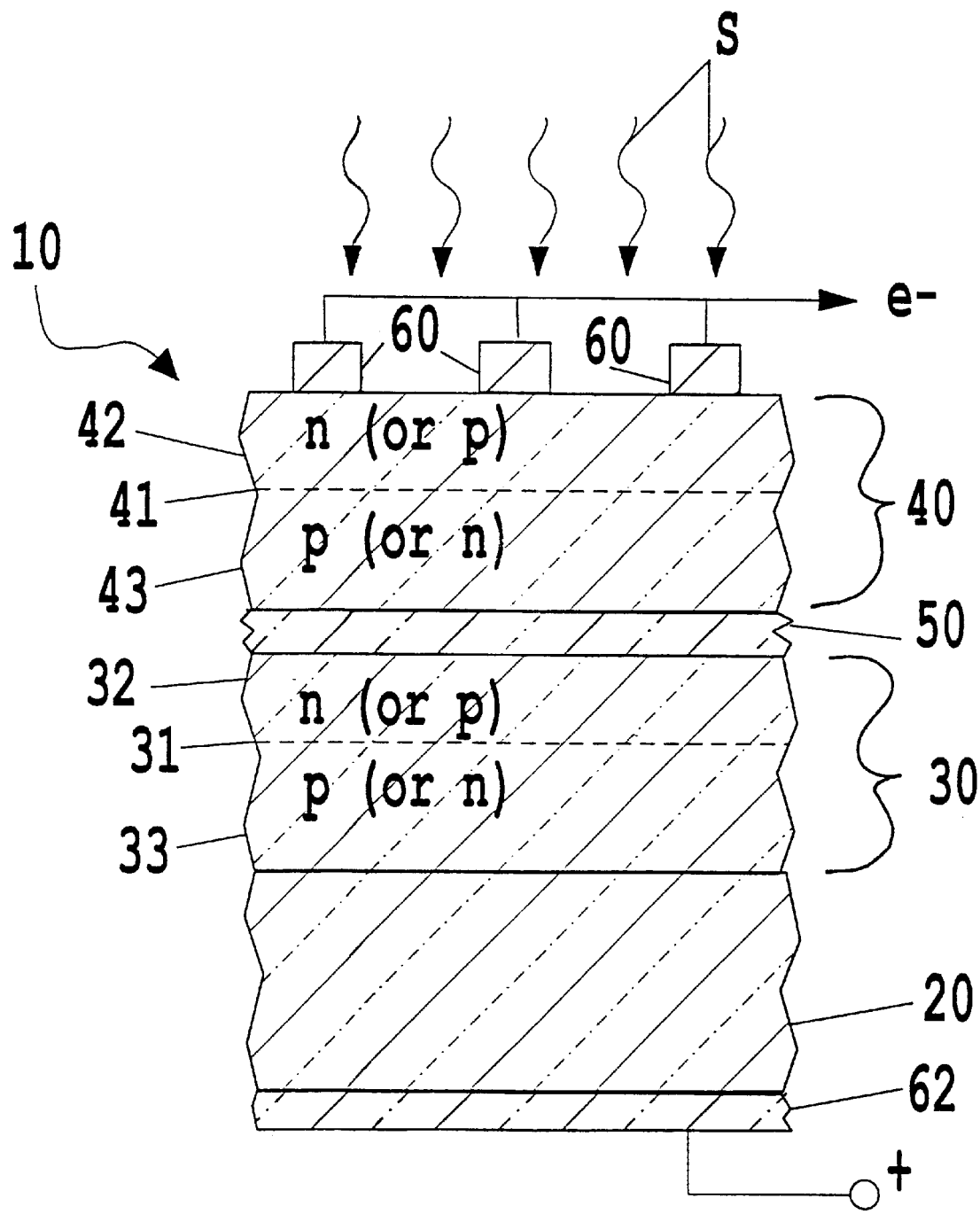
FIG. 1 is a side elevation view in schematic cross-section of a multi-junction, monolithic solar cell of the present invention having two active junctions on a substrate.

A two-junction solar cell 10 according to the present invention is illustrated in schematic in FIG. 1 with exaggerated dimensions and proportions for clarity, as will be readily understood by persons skilled in the art. The solar cell 10 is a tandem device in which each layer of crystalline material is epitaxially deposited (i.e., grown) on the previously deposited layer to form the solar cell 10 from a single crystal (i.e., monolithic). Persons skilled in the art understand that the growth of each layer of crystalline material attempts to mimic the crystalline structure (i.e., lattice constant) of the initial layer or substrate, although many materials are different enough to cause stresses and mismatches at interfaces of such materials. Such mismatches in lattice constant between the layers of material may result in significant reductions in the power conversion efficiency of the solar cell device 10. In this regard, one of the important aspects of the present invention is the careful selection of materials for each layer of the solar cell device 10 that have lattice constants which are substantially equal to that of the substrate (i.e., lattice-matched materials). In this context, lattice-matched materials means two materials with lattice constants that are similar enough that when the two materials are grown adjacent to each other in a single crystal the difference or mismatch between lattice constants is resolved by elastic deformation not by inelastic relaxation which often results in the formation of dislocations or other undesirable defects.

The solar cell device 10 generally includes a substrate 20, a first cell 30 with a junction 31, a second cell 40 with a junction 41, and a tunnel junction 50. As solar radiation, S, strikes the solar cell device 10, the first cell 30 and second cell 40 each absorbs a portion of the solar radiation, S, and converts the energy in the form of photons of the solar radiation, S, to useable electric energy, measured in photovoltage and photocurrent. To accomplish this solar to electric energy conversion, the first cell 30 and the second cell 40 comprise layers of materials 32, 33 and 42, 43, respectively, that are doped (e.g., impurities are added that accept or donate electrons) to form n-type and p-type semiconductors. In this manner, the p/n or n/p junctions 31, 41 are formed in each of the first and second cells 30, 40, respectively. Photons in the received sun light, S, having energy, in eV, greater than the designed band gap of the active top cell 40 will be absorbed and converted to electricity across the semiconductor junction 41 or may pass through the active top cell 40 to the next cell 30. Photons with energy less than the designed band gap of the top cell 40 will pass through the top cell 40 to the next active cell 30. Such lower energy sun light, S, may be absorbed and converted to electricity across junction 31. To improve efficient conversion of a fuller range of the solar spectrum or energy, S, to electricity, it is preferable that the lower cell 30 has a band gap that differs significantly from the band gap of top cell 40, thereby enabling incremental or stepwise absorption of photons of varying energy levels or wavelengths.

In this regard, the illustrated solar cell device 10 is configured to absorb light in two incremental steps. In the top cell 40, photons with energy above about 1.75 eV is absorbed, and photons of energy between about 1.1 eV and 1.75 eV are absorbed in the next cell 30. As shown, the cells 30, 40 are grown on a crystalline, passivated substrate 20.

A significant feature of the present invention is the provision of materials that are lattice-matched to the material of the substrate 20. In this regard, Gallium arsenide (GaAs) and germanium (Ge) are desirable base materials for monolithic solar cells for a number of reasons, including the fact that they have similar lattice constants, similar thermal expansion characteristics, and are generally durable. As discussed above, the efficiency of the solar cell device 10 is dependent on lattice-matching of each layer of the solar cell 10 to the substrate 20 and to intervening layers. With this in mind, the materials of this invention are selected carefully to provide lattice-matching to a GaAs or Ge substrate 20 while providing the above noted energy absorption qualities.

In another significant feature of the present invention, the inventors have recognized that desired band gaps and lattice-matching may be achieved by fabricating the first cell 30 from a number of semiconductor materials, including $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$. The growth process of these compounds is preferably controlled such that the band gap of the first cell 30 is greater than about 0.67 eV and less than about 1.3 eV, and more preferably is about 1.0 eV. More particularly, in one preferred embodiment, the first cell is $Ga_xIn_{1-x}As_yN_{1-y}$ with x in the range of 0.85 to 0.95 and y in the range of 0.95 to 0.99 and a band gap of about 1 eV. The second cell 40 may also be fabricated from a number of materials, including $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$. To provide desired energy conversion, the growth of the second cell 40 is controlled to create a band gap in the range of about 1.3 to about 1.8 eV, and more preferably a band gap of about 1.6 eV. Each of these materials or compounds is controllably made to have a lattice constant that is substantially equivalent to the material (i.e., GaAs or Ge) selected for the substrate 20. As may be appreciated, the design of the solar cell device 10 facilitates efficient energy conversion for sun light, S, with energy greater than about 1.0 eV.

An electrical load (not shown) can be connected to the solar cell device 10 via grid electrical contacts 60 on top of the solar cell device 10 and ohmic plate contact 62 at the bottom to facilitate flow of photocurrent e−, o+ through the solar cell device 10. In other words, the cells 30, 40 are connected in a series circuit. As may be appreciated, the selection of the direction of conductivity through the solar cell device 10 is controlled by the configuration or polarity of the active junctions 31, 41, and the present invention is expressly applicable to current flow in either direction through the solar cell device 10.

To facilitate photocurrent flow between cells 30, 40, the solar cell device 10 according to this invention includes a low-resistivity tunnel junction layer 50. The tunnel junction layer 50 may take a number of forms to provide a thin layer 50 of materials that allows current to pass between cells 30, 40 without generating a voltage drop large enough to significantly decrease the conversion efficiency of the solar cell device 10 and that preserves lattice-matching between the cells 30, 40. For example, the tunnel junction layer 50 may be highly doped semiconductor materials, such as GaAs.

To further facilitate this photocurrent flow and conversion efficiency of the solar cell device 10, the first and second cells 30, 40 may be grown to predetermined thicknesses to absorb respective amounts of solar energy, S, in each cell 30, 40 thus producing matching amounts of photocurrent across each of the junctions 31, 41. This matched current production is important because the cells 30, 40 are stacked, thus connected in series, which means current flow through the solar cell device 10 is limited to the smallest current flow in any particular layer of the solar cell device 10. The current flow across each junction 31, 41 is preferably matched in each cell 30, 40 at the maximum power level of the solar cell device 10 or at the short-circuit current level, and more preferably at a point between these levels for improved solar energy conversion efficiency. Further, the thicknesses of each active cell in the solar cell device 10 may be selected to provide optimized solar energy conversion efficiency at the time the solar cell device 10 is made and/or for a predetermined point in the service life of the solar cell device 10. For example, the thicknesses may be increased or decreased at the time of manufacture to produce a solar cell device 10 with high efficiency for use in a device to be used in space, such as a telecommunications satellite, where semiconductor materials layers may degrade. Those persons skilled in the art will further understand that the conversion efficiency of the solar cell device 10 may be optimized through a variety of methods, depending on the semiconductor materials utilized, including selecting the thicknesses of the layers to control cell voltages and, in special circumstances, to mismatch the photocurrent flow (e.g., have a larger photocurrent flow in the bottom cell).

In contrast to the photocurrent of the solar cell device 10, the photovoltage, which depends on the band gaps of the cells 30, 40, are additive across the solar cell device 10. Therefore, a plurality of semiconductor cells 30, 40, and active junctions 31, 41 of different photovoltages may be utilized to convert the solar radiation, S, received by the solar cell device 10 to a photovoltage that is cumulative of the individual photovoltage levels of the several cells 30, 40.

Figure 2:
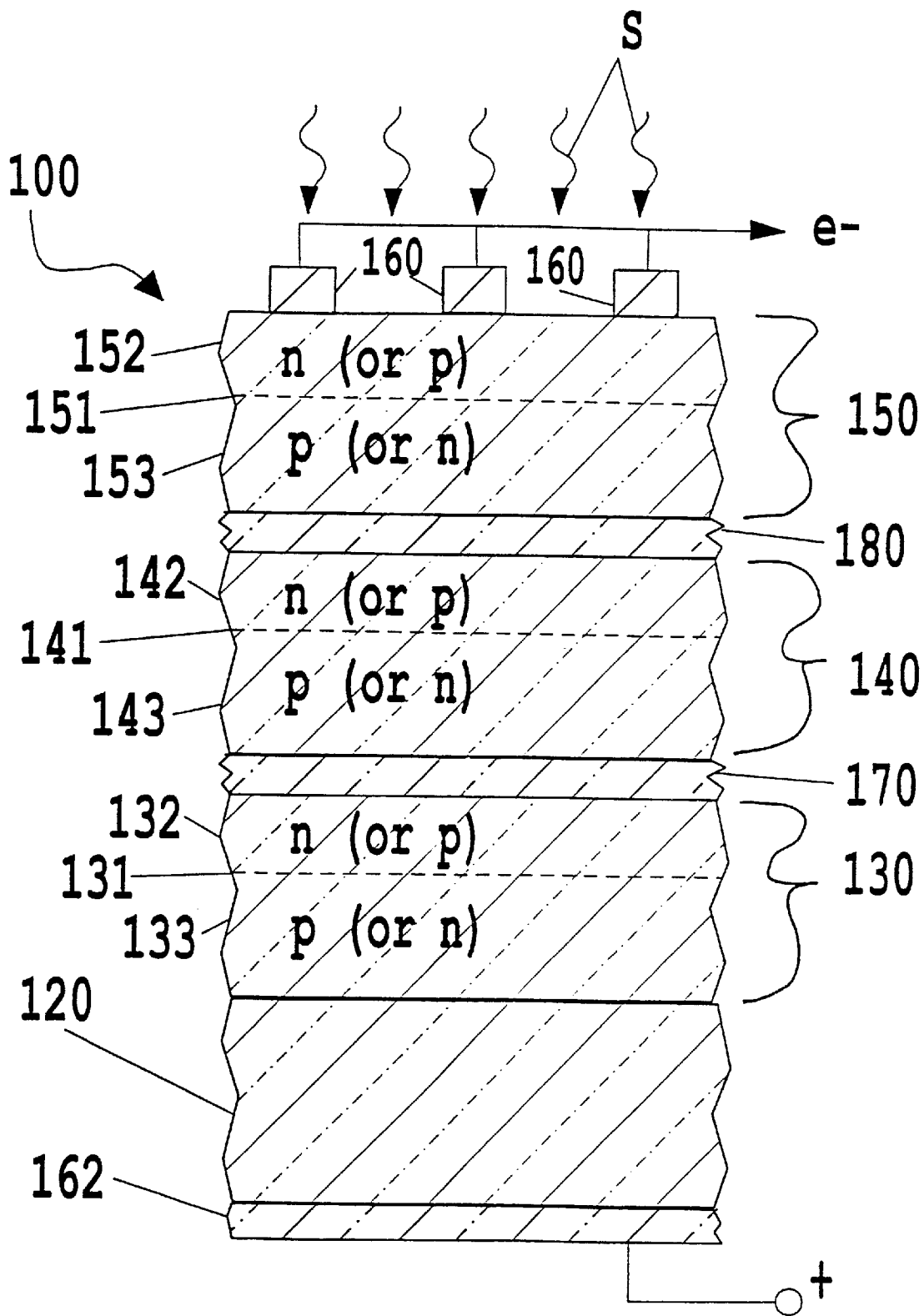
FIG. 2 is a side elevation view in schematic cross-section of a multi-junction, monolithic solar cell according to the present invention having three active junctions on a substrate.

A three-junction solar cell device 100 according to the present invention is illustrated in FIG. 2. From the above discussion, it may be clear that the use of additional power absorption cells or junctions may improve the efficiency of the solar cell device 100 by providing tighter or smaller incremental absorption of the solar spectrum, S. The components of the solar cell device 100 are similar to that of the two-junction solar cell device 10, and include a GaAs or Ge substrate 120, three semiconductor cells 130, 140, and 150 with active junctions 131, 141, and 151, respectively, comprising doped semiconductor material layers 132, 133, 142, 143, and 152, 153, respectively, tunnel junction layers 170 and 180 to facilitate photocurrent flow, and front electrical contacts 160 and back contact 162 to apply a load to the solar cell device 100. As with the two-junction solar cell device 10, the cells 130, 140, and 150 are preferably fabricated from a material(s) that have lattice constants that are substantially equal to that of the material (Ge or GaAs) selected for the substrate 120 to provide lattice-matching throughout the solar cell device 100 and improve conversion efficiency. Additionally, cells 130, 140, and 150 are current matched by controlling the thickness, with the final thickness depending upon the specific material or alloy selected for each layer.

The inventors have recognized that a number of unique embodiments may be created for a three-junction solar cell to meet these requirements and to efficiently absorb an improved portion of the solar spectrum, S. In one such embodiment of the present invention, the band gaps of the cells 130, 140, and 150 are selected such that junction 151 of cell 150 absorbs photons with energy greater than about 1.7 eV, junction 141 of cell 140 absorbs photons with energies between about 1.2 eV and about 1.7 eV, and junction 131 of cell 130 absorbs photons with energies between about 0.67 eV and about 1.2 eV.

Persons skilled in the art will recognize that this embodiment provides an important improvement by enabling the absorption of photons with energies ranging from about 0.67 eV to 1.7 eV in two steps rather than one step, thereby facilitating the production of a larger photovoltage. Further, the materials for each of the cells 130, 140, and 150 are selected and/or produced to have lattice constants substantially equal to that of the substrate 120 material (i.e., Ge or GaAs). In this regard, cell 150 is preferably fabricated from one of the following compounds $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$ with junction 151 having a band gap in the range of 1.6 to 1.9 eV, and more preferably a band gap of about 1.7 eV. Cell 140 is preferably fabricated from one of the following compounds $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$ and with a band gap in junction 141 greater than about 1.1 eV and less than about 1.3 eV, and more preferably a band gap of about 1.2 eV. More particularly, in one preferred embodiment, cell 140 is $Ga_xIn_{1-x}As_yN_{1-y}$ with x in the range of 0.94 to 0.99 and y in the range of 0.98 to 0.99 and a band gap injunction 141 of about 1.2 eV. Cell 130 is preferably fabricated from one of the following materials Ge, $Ga_xIn_{1-x}As_yN_{1-y}$, and $(GaAs)_x(Ge_2)_{1-x}$ and with a band gap injunction 131 between about 0.67 eV and 0.9 eV, and more preferably a band gap of about 0.67 eV.

In a second embodiment of the three-junction solar cell device 100 of the present invention, the band gaps of the junctions 131, 141, and 151 in cells 130, 140, and 150, respectively, are selected such that junction 151 of cell 150 absorbs photons with energy greater than about 1.85 eV, junction 141 of cell 140 absorbs photons with energies between about 1.4 eV and about 1.85 eV, and junction 131 of cell 130 absorbs photons with energies between about 1 eV and about 1.4 eV. An important improvement with this embodiment is the absorption of photons with energies ranging from about 1 eV to 1.4 eV, thereby facilitating the production of a larger photovoltage.

As stated above, the materials for each of the cells 130, 140, and 150 are selected and/or produced to have lattice constants substantially equal to that of the substrate 120 material (i.e., Ge or GaAs). In this regard, cell 150 is preferably fabricated from one of the following compounds $Ga_{0.5}In_{0.5}P$, $Al_xGa_{1-x}As$, and $Al_xGa_{0.5-x}In_{0.5}P$ with a band gap in junction 151 in the range of 1.8 eV to 2.0 eV, and more preferably a band gap of about 1.85 eV. Cell 140 is preferably fabricated from one of the following compounds GaAs, $Ga_xIn_{1-x}As_yN_{1-y}$, $Al_xGa_{1-x}As$, and $Ga_xIn_{1-x}As_yP_{1-y}$ with a band gap injunction 141 in the range of 1.3 eV to 1.5 eV, and more preferably a band gap of about 1.4 eV. Cell 130 is preferably fabricated from one of the following materials $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$ and with a band gap in junction 131 between about 0.9 eV and about 1.1 eV, and more preferably a band gap of about 1 eV. More particularly, in one preferred embodiment, cell 130 is $Ga_xIn_{1-x}As_yN_{1-y}$ with x in the range of 0.85 to 0.95 and y in the range of 0.95 to 0.99 and a band gap in junction 131 of about 1 eV.

As recognized by the inventors, the two embodiments of the three-junction solar cells of the present invention, with corresponding variations in semiconductor material, represent an important improvement over two-junction solar cells. These three-junction solar cells allow a solar cell to be fabricated to convert solar radiation to electrical energy in three steps, with each step having a small difference in band gaps, or in photon energies absorbed. This incremental process may be continued with the addition of additional active junctions that provide one additional step for converting the received solar radiation. Again, the solar cell is preferably fabricated to be lattice- and current-matched.

Figure 3:
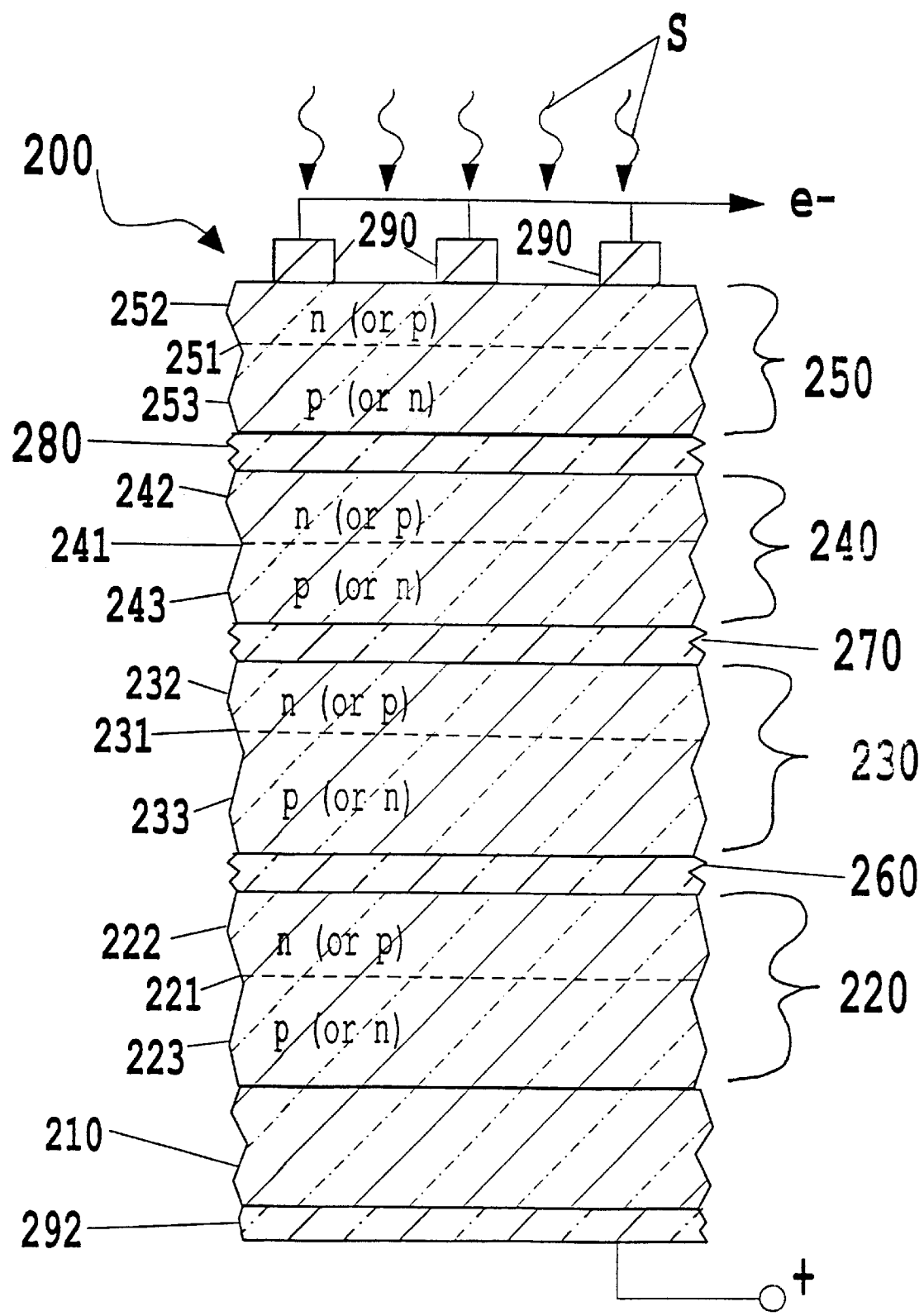
FIG. 3 is a side elevation view in schematic cross-section of a multi-junction, monolithic solar cell according to the present invention having four active junctions on a substrate.

In another significant feature of the present invention, a four-junction, monolithic solar cell device 200 of the present invention which absorbs solar radiation in four steps is illustrated in FIG. 3. A variety of semiconductor materials and substrates may be utilized to fabricate four-junction cell device 200 with the added (fourth) junction being selected to have a band gap that better facilitates absorption of the solar spectrum. For example, solar cell device 200 may be designed with a junction having a band gap lower, intermediate, or higher than in a three-junction cell to improve the solar to electric energy conversion of a three-junction solar cell device. As illustrated, the solar cell device 200 includes a GaAs or Ge substrate 210, semiconductor cells 220, 230, 240, and 250 with active junctions 221, 231, 241, and 251, respectively, comprising selectively doped semiconductor material layers 222, 223, 232, 233, 242, 243, and 252, 253, respectively, tunnel junction layers 260, 270, and 280, and grid electrical contacts 290 and ohmic contact 292 for applying a load (not shown) to the solar cell device 200. The illustrated solar cell device 200 combines a new, bottom, fourth cell 220 with active junction 221, with the cells 130, 140, and 150 of the second embodiment of the three-junction solar cell 100 discussed above. In this regard, cells 230, 240, and 250 of solar cell device 200 correspond to the materials given in the second embodiment for cells 130, 140, and 150 of solar cell device 100. With the addition of cell 220 with active junction 221, the solar cell device 200 advantageously absorbs photons with energy ranging from 0.67 eV to about 1 eV which were not absorbed in the second embodiment above. The higher band gap value junctions 231, 241, and 251 are retained to absorb and convert high energy solar radiation, S, and this converted electric energy is added to electrical energy produced in the lower band gap energy junction 221, thereby obtaining an improved photovoltage output for the solar cell device 200.

The cell 220 is preferably fabricated from a material with a lattice constant substantially equal to that of GaAs or Ge, and may be fabricated from Ge, $Ga_xIn_{1-x}As_yN_{1-y}$, and $(GaAs)_x(Ge_2)_{1-x}$ with a band gap between about 0.6 eV and 0.8 eV, and more preferably a band gap of about 0.67 eV. With the selection and use of these semiconductor and substrate materials, the present invention effectively balances the benefits of lattice-matching a solar cell with fabricating a solar cell that efficiently converts an improved portion of received solar radiation into useful energy.

Although not shown, the present inventors recognize that the above embodiments may be readily modified to provide the active cells or energy conversion portion for numerous solar cell arrangements or circuits. More particularly, the substrate layer of GaAs or Ge may be removed upon completion of growing the active cells discussed in detail above. The active cells may be utilized in a variety of electrical contact configurations, such as, the interconnection of a number of stacks of the active cells of the present invention in a series circuit via known conductive materials and layers and standard contact methods.

Further, the device of the present invention may comprise other well-known solar cell layers or coatings to increase the total energy conversion efficiency, such as, anti-reflective coatings, a passivating window layer on the front of the solar cell, and a passivating back surface field, each of which is described in U.S. Pat. No. 5,223,043. Further, the present invention is directed to various methods of obtaining active junctions, such as, n+pp+-doping, p+nn+-doping, and other known methods of fabricating semiconductor cells to control conductivity and cell efficiencies. For example, homojunctions and heterojunctions may be used individually or in combination to fabricate the solar cells of the present invention.

More particularly, in each of the above discussed embodiments, the junctions 31, 41, 131, 141, 151, 221, 231, 241, and 251 may be heterojunctions to facilitate fabrication of an improved efficiency solar cell. Generally, heterojunctions include a base layer and an emitter layer of semiconductor material adjacently positioned and doped for n or p conductivity to form an n/p junction. In the present invention, each of the active cells 30, 40, 130, 140, 150, 220, 230, 240, and 250 may include heterojunctions, and especially, cells having band gaps near 1 eV, such as cells 30, 130, 140, 220, and 230. The base layers of these heterojunctions 31, 131, 141, 221, and 231 are lower semiconductor material layers 33, 133, 143, 223, and 233 fabricated from the materials as discussed in detail above. The emitter layer of these heterojunctions 31, 131, 141, 221, and 231 is upper semiconductor material layers 32, 132, 142, 222, and 232 fabricated from a dissimilar material from the group of materials including GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$. The use of heterojunctions to fabricate the cells of the present invention enables the efficiency of the solar cell to be improved providing a greater selection of cell thicknesses to match photocurrent and photovoltage while maintaining lattice-matching with GaAs or Ge.

While the use of semiconductor materials including, for example, nitrogen, boron, copper, and germanium-gallium arsenide, are applied in the solar cells of the present invention, each of these solar cells may be fabricated with any of a variety of methods known by people skilled in the art. In this regard, steps for fabricating two-junction, current-matched, lattice-matched solar cells with then-known semiconductor materials on GaAs have been described in U.S. Pat. No. 5,223,043, which is incorporated herein by reference thereto, and which fabrication details form no part of this invention. For example, U.S. Pat. No. 5,223,043 teaches a solar cell structure including a top cell comprising GaInP semiconductor material, a bottom cell comprising GaAs material, and a heterojunction interface between the top cell and the bottom cell, such that the top cell is lattice matched with the bottom cell. The GaInP cell is grown with a thickness between 0.4 and 1.7 microns and is less than the thickness of the GaAs cell in order to provide current matching between the top cell and the bottom cell.

Pursuant to the present invention, fabrication of three or four junction, tandem, solar cells with a GaAs or Ge substrate may also be done in a well-known manner, as is fully described in U.S. Pat. No. 4,667,059, which is also incorporated herein by reference thereto, and which fabrication details form no part of this invention. Techniques are described in the U.S. Pat. No. 4,667,059 for fabricating a multi-junction and a multi-cell solar cell, which utilizes both Ge and GaAs substrates. The solar cell includes a top cell comprising a GaInP semiconductor material; a bottom cell including a GaAs material; and a low-resistance tunnel interface between the top cell and the bottom cell, such that, the top cell is lattice matched with the bottom cell.

In practicing the present invention, the production of an active Ge bottom cell with lattice-matched tandem cells formed from GaAs and AlGaAs materials will be done in a well-known manner, as is described in the following articles: Tobin et al; High Efficiency GaAs/Ge Monolithic Tandem Solar Cells; IEEE (1988) and Timmons, et.al.; Monolithic AlGaAs/Ge Cascade Solar Cells; IEEE (1988), which are incorporated herein by reference thereto, and which production details form no part of this invention. For example, these articles describe tandem cells grown using n-type Ge substrates with active Ge bottom cells and GaAs-like (AlGaAs which is lattice-matched to GaAs) top cells. It is obvious that the production details provided by these articles supplement the production details of U.S. Pat. Nos. 4,667,059 and 5,223,043 mentioned herein above.

The foregoing description is considered as illustrative of the principles of the invention. Furthermore, since numerous modifications and changes will readily occur to those skilled in the art, it is not desired to limit the invention to the exact constructions and processes shown as described above. For example, the present invention discloses a number of unique semiconductor materials, such as, for example, crystalline alloys including nitrogen, phosphorus, boron, copper, selenium, sulfur, indium, aluminum, and germanium-gallium arsenide, that are substantially lattice-matched to GaAs and Ge. With the disclosure of these materials, many other possible material combinations based on these materials will become clear to those skilled in the art of designing and fabricating solar cells. Accordingly, all suitable modifications and equivalents may be resorted to that fall within the scope of the invention as defined by the claims which follow.

What is claimed is:

1. A multi-junction, monolithic, photovoltaic solar cell device configured for converting photons from the sun into electrical current and voltage, said solar cell device comprising:

a substrate comprising a crystalline material having a predetermined lattice constant, wherein said crystalline material is GaAs or Ge;

a first active cell positioned on said substrate, said first active cell comprising a junction of at least one p-type semiconductor layer in face-to-face contact with one n-type semiconductor layer, wherein each of said semiconductor layers is fabricated from a material selected from a group consisting of $(GaAs)_x(Ge_2)_{1-x}$, $B_xGa_yIn_{1-x-y}As$, $CuInS_xSe_{2-x}$, and $Cu_3AsS_xSe_{4-x}$ and that has a lattice constant substantially equal to said lattice constant of said substrate crystalline material and wherein said first active cell has a band gap greater than about 0.67 eV and less than about 1.3 eV;

a second active cell positioned adjacent said first active cell, said second active cell comprising a junction of at least one p-type semiconductor layer in face-to-face contact with one n-type semiconductor layer, wherein each of said semiconductor layers has a lattice constant substantially equal to said lattice constant of said substrate crystalline material;

a tunnel junction layer interposed between said first active cell and said second active cell, said tunnel junction layer comprising materials for facilitating current flow between said first active cell and said second active cell; and electrical contacts attached to said solar cell device to conduct current away from and into said solar cell device.

2. The solar cell device of claim 1, wherein said first and second active cells each have a thickness, said thickness of each of said active cells being selected to optimize the solar to electrical energy conversion efficiency of said solar cell device.

3. The solar cell device of claim 1, wherein said semiconductor layers of said second active cell are fabricated from a material selected from the group consisting of $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$ and, further, wherein said junction of said second active cell has a band gap in the range of 1.3 to 1.8 eV.

4. The solar cell device of claim 3, said solar cell device further comprising:

a third active cell positioned between said substrate and said first active cell, said third active cell comprising a junction of at least one p-type semiconductor layer in face-to-face contact with one n-type semiconductor layer, wherein each of said semiconductor layers has a lattice constant substantially equal to said lattice constant of said substrate crystalline material, and, further, wherein said junction of said third active cell has a band gap in the range from about 0.67 eV to about 0.9 eV; and a second tunnel junction layer interposed between said first active cell and said third active cell, said tunnel junction layer comprising materials for facilitating current flow between said first active cell and said third active cell.

5. The solar cell device of claim 4, wherein said semiconductor layers of said third active cell are fabricated from a material selected from the group consisting of Ge, $Ga_xIn_{1-x}As_yN_{1-y}$, and $(GaAs)_x(Ge_2)_{1-x}$ and, further, wherein said first, second and third active cells each have a thickness, said thickness of each of said active junctions being selected to optimize the solar to electrical energy conversion efficiency of said solar cell device.

6. The solar cell device of claim 5, wherein said junction of said first active cell has a band gap in the range of about 1.1 eV to 1.3 eV and said junction of said second active cell has a band gap in the range of 1.6 eV to 1.9 eV.

7. The solar cell device of claim 6, said junction of said third active cell being a heterojunction, wherein said semiconductor layers of said first active cell are fabricated from a base material and an emitter material, said base material being selected from the group consisting of Ge, $Ga_xIn_{1-x}As_yN_{1-y}$, and $(GaAs)_x(Ge_2)_{1-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$.

8. The solar cell device of claim 3, wherein said material for said semiconductor layers of said first active cell is selected such that said band gap of said junction of said first active cell is about 1 eV.

9. The solar cell device of claim 1, said solar cell device further comprising:

a third active cell positioned adjacent said second active cell, said third active cell comprising a junction of at least one p-type semiconductor layer in face-to-face contact with one n-type semiconductor layer, wherein each of said semiconductor layers has a lattice constant substantially equal to said lattice constant of said substrate crystalline material, and, further, wherein said junction has a band gap in the range of 1.8 eV to about 2.0 eV; and a second tunnel junction layer interposed between said second cell and said third active cell, said tunnel junction layer comprising materials for facilitating current flow between said first active cell and said third active cell.

10. The solar cell device of claim 9, wherein said semiconductor layers of said first active cell are fabricated from a material selected from the group consisting of $(GaAs)_x(Ge_2)_{1-x}$, $B_xGa_yIn_{1-x-y}As$, $CuInS_xSe_{2-x}$, and $Cu_3AsS_xSe_{4-x}$ and, further, wherein said junction of said first active cell has a band gap in the range of 0.9 to 1.1 eV.

11. The solar cell device of claim 10, wherein said semiconductor layers of said second active cell are fabricated from a material selected from the group consisting of GaAs, $Ga_xIn_{1-x}As_yN_{1-y}$, $Al_xGa_{1-x}As$, and $Ga_xIn_{1-x}As_yP_{1-y}$ and, further, wherein said junction of said second active cell has a band gap in the range of 1.3 to 1.5 eV.

12. The solar cell device of claim 11, wherein said semiconductor layers of said third active cell are fabricated from a material selected from the group consisting of $Ga_{0.5}In_{0.5}P$, $Al_xGa_{1-x}As$, and $Al_xGa_{0.5-x}In_{0.5}P$ and, further, wherein said first, second and third active cells each have a thickness, said thickness of each of said active cells being selected to optimize the solar to electrical energy conversion efficiency of said solar cell device.

13. The solar cell device of claim 12, wherein said material for said semiconductor layers of said first active cell is selected such that said band gap of said junction of said first active cell is about 1 eV.

14. The solar cell device of claim 12, said junction of said second active cell being a heterojunction, wherein said semiconductor layers of said second active cell are fabricated from a base material and an emitter material, said base material being selected from the group consisting of GaAs, $Ga_xIn_{1-x}As_yN_{1-y}$, $Al_xGa_{1-x}As$, and $Ga_xIn_{1-x}As_yP_{1-y}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$.

15. The solar cell device of claim 12, said solar cell device further comprising:
a fourth active cell positioned between said substrate and said first active junction, said fourth active junction comprising a junction of at least one p-type semiconductor layer in face-to-face contact with one n-type semiconductor layer, wherein each of said semiconductor layers has a lattice constant substantially equal to said lattice constant of said substrate crystalline material, and, further, wherein said junction of said fourth active cell has a band gap in the range of about 0.6 eV to about 0.8 eV; and
a third tunnel junction layer interposed between said fourth active cell and said first active cell, said tunnel junction layer comprising materials for facilitating current flow between said first active cell and said third active cells.

16. The solar cell device of claim 15, wherein said semiconductor layers of said fourth active cell are fabricated from a material selected from the group consisting of Ge, $Ga_xIn_{1-x}As_yN_{1-y}$, and $(GaAs)_x(Ge_2)_{1-x}$ and, further, wherein said first, second, third, and fourth active cells each have a thickness, said thickness of each of said active cells being selected to optimize the solar to electrical energy conversion efficiency of said solar cell device.

17. The solar cell device of claim 16, said junction of said fourth active cell being a heterojunction, wherein said semiconductor layers of said fourth active cell are fabricated from a base material and an emitter material, said base material being selected from the group consisting of Ge, $Ga_xIn_{1-x}As_yN_{1-y}$, and $(GaAs)_x(Ge_2)_{1-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$.

18. A multi-junction, monolithic, photovoltaic solar cell device configured for converting photons from the sun into electrical current and voltage, said solar cell device comprising:
a substrate comprising a crystalline material having a lattice constant, wherein said crystalline material is GaAs or Ge;
a first active cell positioned on said substrate, said first active cell comprising a heterojunction fabricated from a base material and an emitter material, said base material having a lattice constant substantially equal to said lattice constant of said substrate crystalline material and a band gap between about 0.67 eV and about 1.3 eV and being selected from the group consisting of $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$;
a second active cell with a bandgap in a range of about 1.3 to 1.8 eV positioned adjacent said first active cell, said second active cell being fabricated from a material that has a lattice constant substantially equal to said lattice constant of said substrate crystalline material and being selected from the group consisting of $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$.

19. A multi-junction, monolithic, photovoltaic solar cell device grown on a crystalline substrate and configured for use in an electrical circuit for converting photons from the sun into electrical current and voltage, said solar cell device comprising:
a first active cell comprising a junction of at least one p-type semiconductor layer in face-to-face contact with one n-type semiconductor layer, wherein each of said semiconductor layers is fabricated from a material selected from the group consisting of $(GaAs)_x(Ge_2)_{1-x}$, $B_xGa_yIn_{1-x-y}As$, $CuInS_xSe_{2-x}$, and $Cu_3AsS_xSe_{4-x}$ and has a lattice constant substantially equal to a lattice constant of GaAs or Ge and, further, wherein said first active cell has a band gap greater than about 0.67 eV and less than about 1.3 eV;
a second active cell positioned adjacent said first active cell, said second active cell comprising a junction of at least one p-type semiconductor layer in face-to-face contact with one n-type semiconductor layer, wherein each of said semiconductor layers is fabricated from a material selected from the group consisting of $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$, and has a lattice constant substantially equal to said lattice constant of said semiconductor layers of said first active cell and, further, wherein said junction of said second active cell has a band gap in the range of 1.3 to 1.8 eV; and
a tunnel junction layer interposed between said first active cell and said second active cell, said tunnel junction layer comprising materials for facilitating current flow between said first active cell and said second active cell.

20. The solar cell device of claim 19, wherein said material for said semiconductor layers of said first active cell is selected such that said band gap of said junction of said first active cell is about 1 eV.

21. The solar cell device of claim 19, said solar cell device further comprising:
a third active cell positioned between said substrate and said first active cell, said third active cell comprising a junction of at least one p-type semiconductor layer in face-to-face contact with one n-type semiconductor layer, wherein each of said semiconductor layers has a lattice constant substantially equal to said lattice constant of said semiconductor layers of said second active cell; and
a second tunnel junction layer interposed between said first active cell and said third active cell, said tunnel junction layer comprising materials for facilitating current flow between said first active cell and said third active cell.

22. The solar cell device of claim 21, wherein said semiconductor layers of said third active cell are fabricated from a material selected from the group consisting of Ge, $Ga_xIn_{1-x}As_yN_{1-y}$, and $(GaAs)_x(Ge_2)_{1-x}$ and said junction of said third active cell has a band gap in the range from about 0.67 eV to about 0.9 eV, and further, wherein said junction of said first active cell has a band gap in the range of about 1.1 eV to 1.3 eV and said junction of said second active cell has a band gap in the range of 1.6 eV to 1.9 eV.

23. The solar cell device of claim 21, said junction of said third active cell being a heterojunction, wherein said semiconductor layers of said first active cell are fabricated from a base material and an emitter material, said base material being selected from the group consisting of Ge, $Ga_xIn_{1-x}As_yN_{1-y}$, and $(GaAs)_x(Ge_2)_{1-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$.

24. The solar cell device of claim 19, wherein said junction of said first active cell has a band gap in the range of 0.9 to 1.1 eV and further, wherein said junction of said second active cell has a band gap in the range of 1.3 to 1.5 eV, and wherein said solar cell device further comprises:
   a third active cell positioned adjacent said second active cell, said third active cell comprising a junction of at least one p-type semiconductor layer in face-to-face contact with one n-type semiconductor layer, wherein each of said semiconductor layers has a lattice constant substantially equal to said lattice constant of said semiconductor layers of said second active cell and said junction has a band gap in the range of 1.8 eV to about 2.0 eV; and
   a second tunnel junction layer interposed between said second cell and said third active cell, said tunnel junction layer comprising materials for facilitating current flow between said first active cell and said third active cell.

25. The solar cell device of claim 24, wherein said semiconductor layers of said third active cell are fabricated from a material selected from the group consisting of $Ga_{0.5}In_{0.5}P$, $Al_xGa_{1-x}As$, and $Al_xGa_{0.5-x}In_{0.5}P$ and, further, wherein said first, second and third active cells each have a thickness, said thickness of each of said active cells being selected to optimize the solar to electrical energy conversion efficiency of said solar cell device.

26. The solar cell device of claim 25, said solar cell device further comprising:
   a fourth active cell positioned between said substrate and said first active junction, said fourth active junction comprising a junction of at least one p-type semiconductor layer in face-to-face contact with one n-type semiconductor layer, wherein each of said semiconductor layers has a lattice constant substantially equal to said lattice constant of said semiconductor layers of said first active junction, and, further, wherein said junction of said fourth active cell has a band gap in the range of about 0.6 eV to about 0.8 eV; and
   a third tunnel junction layer interposed between said fourth active cell and said first active cell, said tunnel junction layer comprising materials for facilitating current flow between said first active cell and said third active cells.

27. The solar cell device of claim 26, wherein said semiconductor layers of said fourth active cell are fabricated from a material selected from the group consisting of Ge, $Ga_xIn_{1-x}As_yN_{1-y}$, and $(GaAs)_x(Ge_2)_{1-x}$ and, further, wherein said first, second, third, and fourth active cells each have a thickness, said thickness of each of said active cells being selected to optimize the solar to electrical energy conversion efficiency of said solar cell device.

28. The solar cell device of claim 27, said junction of said fourth active cell being a heterojunction, wherein said semiconductor layers of said fourth active cell are fabricated from a base material and an emitter material, said base material being selected from the group consisting of Ge, $Ga_xIn_{1-x}As_yN_{1-y}$, and $(GaAs)_x(Ge_2)_{1-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$.

29. A multi-junction, monolithic, photovoltaic solar cell device grown on a crystalline substrate and configured for use in an electrical circuit for converting photons from the sun into electrical current and voltage, said solar cell device comprising:
   a first active cell comprising a junction of at least one p-type semiconductor layer in face-to-face contact with one n-type semiconductor layer, wherein each of said semiconductor layers is semiconductor layers of said first active cell are fabricated from a material selected from the group consisting of Ge and $(GaAs)_x(Ge_2)_{1-x}$ and has a lattice constant substantially equal to a lattice constant of GaAs or Ge and wherein said first active cell has a band gap greater than about 0.67 eV and less than about 0.9 eV;
   a second active cell positioned adjacent said first active cell, said second active cell comprising a junction of at least one p-type semiconductor layer in face-to-face contact with one n-type semiconductor layer, wherein each of said semiconductor layers is fabricated from a material selected from the group consisting of $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$ and has a lattice constant substantially equal to said lattice constant of said semiconductor layers of said first active cell and wherein said second active cell has a band gap in the range of about 1.1 eV to about 1.2 eV; and
   a third active cell positioned adjacent said second active cell, said third active cell comprising a junction of at least one p-type semiconductor layer in face-to-face contact with one n-type semiconductor layer, wherein each of said semiconductor layers is fabricated from a material selected from the group consisting of $Ga_xIn_{1-x}As_yP_{1-y}$, $Ga_xIn_{1-x}N_yP_{1-y}$, $Al_xGa_{1-x}As$, and $Ga_xIn_{1-x}as_yN_zP_{1-y-z}$, and further has a lattice constant substantially equal to said lattice constant of said semiconductor layers of said second active cell and wherein said third active cell has a band gap in the range of about 1.6 eV to about 1.9 eV.

30. A multi-junction, monolithic, photovoltaic solar cell device grown on a crystalline substrate and configured for use in an electrical circuit for converting photons from the sun into electrical current and voltage, and said solar cell device comprising:
   a first active cell comprising a junction of at least one p-type semiconductor layer in face-to-face contact with one n-type semiconductor layer, wherein each of said semiconductor layers of said first active cell is fabricated from a material selected from the group consisting of $(GaAs)_x(Ge_2)_{1-x}$, $B_xGa_yIn_{1-x-y}As$, $CuInS_xSe_{2-x}$, and $Cu_3AsS_xSe_{4-x}$ and has a lattice constant substantially equal to a lattice constant of GaA or Ge and wherein said first active cell has a band gap in the range of about 0.9 eV to about 1.1 eV;
   a second active cell positioned adjacent said first active cell, said second active cell comprising a junction of at least one p-type semiconductor layer in face-to-face contact with one n-type semiconductor layer, wherein each of said semiconductor layers of said second active cell is fabricated from a material selected from the group consisting of GaAs, $Ga_xIn_{1-x}As_yN_{1-y}$, $Al_xGa_{1-x}As$, and $Ga_xIn_{1-x}As_yP_{1-y}$ and has a lattice constant substantially equal to said lattice constant of said semiconductor layers of said first active cell, and wherein said second active cell has a band gap in the range of 1.3 to 1.5 eV; and a third active cell positioned adjacent said second active cell, said third active cell comprising a junction of at least one p-type semiconductor layer in face-to-face contact with one n-type semiconductor layer, wherein each of said semiconductor layers of said third active cell is fabricated from a material selected from the group consisting of $Ga_{0.5}In_{0.5}P$, $Al_xGa_{1-x}As$, and $Al_xGa_{0.5-x}In_{0.5}P$ and has a lattice constant substantially equal to said lattice constant of said semiconductor layers of said second active cell, and wherein said second active cell has a band gap in the range of 1.8 to 2.0 eV.

31. The solar cell device of claim 30, wherein said solar cell device further comprises:

a fourth active cell positioned adjacent and beneath said first active cell, said fourth active cell comprising a junction of at least one p-type semiconductor layer in face-to-face contact with one n-type semiconductor layer, wherein each of said semiconductor layers has a lattice constant substantially equal to said lattice constant of said semiconductor layers of said third active cell and wherein said fourth active cell has a band gap in the range of about 0.6 eV to about 0.8 eV.

32. The solar cell device of claim 31, wherein said semiconductor layers of said fourth active cell are fabricated from a material selected from the group consisting of Ge, $Ga_xIn_{1-x}As_yN_{1-y}$, and $(GaAs)_x(Ge_2)_{1-x}$ and, further, wherein said first, second, third, and fourth active cells each have a thickness, said thickness of each of said active cells being selected to optimize the solar to electrical energy conversion efficiency of said solar cell device.

33. The solar cell device of claim 31, said junction of said fourth active cell being a heterojunction, wherein said semiconductor layers of said fourth active cell are fabricated from a base material and an emitter material, said base material being selected from the group consisting of Ge, $Ga_xIn_{1-x}As_yN_{1-y}$, and $(GaAs)_x(Ge_2)_{1-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$.

34. A multi-junction, monolithic, photovoltaic solar cell device configured for converting photons from the sun into electrical current and voltage, said solar cell comprising:

a substrate comprising a crystalline material having a lattice constant, wherein said crystalline material is GaAs or Ge;

a first active cell positioned on said substrate, said first active cell comprising a heterojunction fabricated from a base material and a emitter material, each of which has a lattice constant substantially equal to the lattice constant of said substrate crystalline material, and a said first active cell having a bandgap in a range of about 0.76 eV to 1.3 eV;

a second active cell positioned adjacent said first active cell, said second active cell having a bandgap in a range of about 1.3 eV to 1.5 eV and being fabricated from a base material and an emitter material, said base material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$, and further wherein each of said base and emitter materials has a lattice constant that is substantially equal to the lattice constant of said substrate crystalline material.

35. The solar cell device of claim 34, said solar cell device further comprising:

a third active cell positioned adjacent said second active cell, said third active cell comprising a junction of at least one p-type semiconductor layer in face-to-face contact with one n-type semiconductor layer, wherein each of said semiconductor layers has a lattice constant substantially equal to said lattice constant of said substrate crystalline material, and, further, wherein said junction has a band gap in the range of 1.8 eV to about 2.0 eV; and a second tunnel junction layer interposed between said second cell and said third active cell, said tunnel junction layer comprising materials for facilitating current flow between said first active cell and said third active cell.

36. The solar cell device of claim 35, wherein said semiconductor layers of said third active cell are fabricated from a material selected from the group consisting of $Ga_{0.5}In_{0.5}P$, and $Al_xGa_{1-x}As$, and, further, wherein said first, second, and third active cells each have a thickness, said thickness of each of said active cells being selected to optimize the solar to electrical energy conversion efficiency of said solar cell device.

37. The solar cell device of claim 36, said solar cell device further comprising:

a fourth active cell positioned between said substrate and said first active junction, said fourth active junction comprising a junction of at least one p-type semiconductor layer in face-to-face contact with one n-type semiconductor layer, wherein each of said semiconductor layers have a lattice constant substantially equal to said lattice constant of said substrate crystalline material, and, further, wherein said junction of said fourth active cell has a band gap in the range of about 0.6 eV to about 0.8 eV; and a third tunnel junction layer interposed between said fourth active cell and said first active cell, said tunnel junction layer comprising materials for facilitating current flow between said first active cell and said third active cells.

38. The solar cell device of claim 37, wherein said semiconductor layers of said fourth active cell are fabricated from a material selected from the group consisting of Ge, $Ga_xIn_{1-x}As_yN_{1-y}$, and $(GaAs)_x(Ge_x)_{1-x}$, and further, wherein said first, second, third, and fourth active cells each have a thickness, said thickness of each of said active cells being selected to optimize the solar to electrical energy conversion efficiency of said solar cell device.

39. The solar cell device of claim 38, said junction of said fourth active cell being a heterojunction, wherein said semiconductor layers of said fourth active cell are fabricated from a base material and an emitter material, said base material being selected from the group consisting of Ge, $Ga_xIn_{1-x}As_yN_{1-y}$, $Al_xGa_{1-x}As$, $Ga_xIn_{1-x}As_yP_{1-y}$, and $Ga_{0.5}In_{0.5}P$.

40. A multi-junction, monolithic, photovoltaic solar cell device grown on a crystalline substrate of Ge or GaAs and configured for use in an electrical circuit for converting photons from the sun into electrical current and voltage, said solar cell device comprising:

a first active cell comprising a junction of at least one p-type semiconductor layer in face-to-face contact with one n-type semiconductor layer, wherein each of said semiconductor layers has a lattice constant substantially equal to a lattice constant of GaAs or Ge and wherein said first active cell has a band gap greater than about 0.67 eV;

a second active cell positioned adjacent said first active cell, said second active cell comprising a junction of at least one p-type semiconductor layer in face-to-face contact with one n-type semiconductor layer, wherein each of said semiconductor layers has a lattice constant substantially equal to said lattice constant of said semiconductor layers of said first active cell and wherein said second active cell has a band gap in the range of about 1.1 eV to about 1.5 eV; and a third active cell positioned adjacent said second active cell, said third active cell comprising a junction of at least one p-type semiconductor layer in face-to-face contact with one n-type semiconductor layer, wherein each of said semiconductor layers has a lattice constant substantially equal to said lattice constant of said semiconductor layers of said second active cell and a band gap in the range of about 1.6 eV to about 2.0 eV, and wherein said semiconductor layers of said third active cell are fabricated from a group consisting of $Ga_{0.5}In_{0.5}P$ and $Al_xGa_{1-x}As$.

41. The solar cell device of claim 40, wherein said semiconductor layers of said first active cell are fabricated from a material selected from the group consisting of $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$ and, further, wherein said band gap of said junction of said first active cell is greater than about 0.67 eV and less than about 1.3 eV.

42. The solar cell device of claim 41, wherein said semiconductor layers of said second active cell are fabricated from a material selected from the group consisting of $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$ and, further, wherein said junction of said second active cell has a band gap in the range of 1.3 to 1.8 eV.

43. The solar cell device of claim 42, wherein said material for said semiconductor layers of said first active cell is $Ga_xIn_{1-x}As_yN_{1-y}$ with x in the range of 0.85 to 0.95 and y in the range of 0.95 to 0.99.

44. The solar cell device of claim 40, said junction of said first active cell being a heterojunction, wherein said semiconductor layers of said first active cell are fabricated from a base material and an emitter material, said base material having a band gap between about 0.67 eV and about 1.3 eV and being selected from the group consisting of $Ga_xIn_{1-x}As_yN_{1-y}$, $(GaAs)_x(Ge_2)_{1-x}$, $B_xGa_yIn_{1-x-y}As$, $CuInS_xSe_{2-x}$, and $Cu_3AsS_xSe_{4-x}$ and said emitter material being selected from the group consisting of GaAs, $Ga_xIn_{1-x}As_yN_{1-y}$, $Al_xGa_{1-x}As$, $Ga_xIn_{1-x}As_yP_{1-y}$, $Ga_{0.5}In_{0.5}P$, and $Al_xGa_{0.5-x}In_{0.5}P$, and further, wherein said semiconductor layers of said second active cell are fabricated from a material selected from the group consisting of $Ga_xIn_{1-x}As_yP_{1-y}$, $Ga_xIn_{1-x}N_yP_{1-y}$, $Al_xGa_{1-x}As$, and $Ga_xIn_{1-x}As_yN_zP_{1-y-z}$ and, further, wherein said junction of said second active cell has a band gap in the range of 1.3 to 1.8 eV.

* * * * *